(12) United States Patent
Lee

(10) Patent No.: US 8,017,027 B2
(45) Date of Patent: Sep. 13, 2011

(54) SEMICONDUCTOR FABRICATING PROCESS

(75) Inventor: Chiu-Te Lee, Hsinchu (TW)

(73) Assignee: Hejian Technology (Suzhou) Co., Ltd., Suzhou (CN)

( * ) Notice: Subject to any disclaimer, the term of this patent is extended or adjusted under 35 U.S.C. 154(b) by 599 days.

(21) Appl. No.: 12/202,548

(22) Filed: Sep. 2, 2008

(65) Prior Publication Data

US 2010/0055912 A1     Mar. 4, 2010

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................................... 216/46; 438/696

(58) Field of Classification Search .................... 216/46; 438/696
See application file for complete search history.

(56) References Cited

U.S. PATENT DOCUMENTS

| 5,998,849 A | 12/1999 | Ishimaru et al. ............... 257/410 |
| 6,017,809 A | 1/2000 | Inumiya et al. ............... 438/585 |
| 2006/0099729 A1* | 5/2006 | Yang ............................... 438/40 |

FOREIGN PATENT DOCUMENTS

CN      1601725      3/2005

OTHER PUBLICATIONS

Chinese First Examination Report of China Application No. 200810186310.1, dated Nov. 4, 2010.

* cited by examiner

*Primary Examiner* — Roberts Culbert
(74) *Attorney, Agent, or Firm* — J.C. Patents

(57) ABSTRACT

A semiconductor fabricating process is provided. First, a substrate is provided. The substrate has thereon a stacked structure and a mask layer disposed on the stacked structure. Thereafter, an oxide layer is formed on a surface of the mask layer and a surface of at least a portion of the stacked structure. Afterwards, a first spacer is formed on a sidewall of the stacked structure. Then, a second spacer is formed on a sidewall of the first spacer. Further, a first etching process is performed to remove the oxide layer on the surface of the mask layer. Thereafter, a second etching process is performed to simultaneously remove the mask layer and the second spacer.

12 Claims, 5 Drawing Sheets

SEMICONDUCTOR FABRICATING PROCESS

BACKGROUND OF THE INVENTION

1. Field of the Invention

The present invention relates to a semiconductor fabricating process and particularly relates to a semiconductor fabricating process using two layers of spacers to protect a stacked structure.

2. Description of Related Art

In a fabricating process of a semiconductor device of 0.13 um or smaller than 0.13 um, the steps for forming a gate structure are described as follows. First, a gate dielectric material layer, a gate material layer, a gate mask material layer, and a patterned photoresist layer are sequentially formed on a substrate. The gate mask material layer is, for example, formed by silicon oxynitride and serves as a dielectric anti-reflective coating layer (DARC layer). Then, the patterned photoresist layer is used as a mask to etch the gate mask material layer, so as to form a gate mask layer. Next, the gate mask layer is used as a mask to etch the gate material layer and the gate dielectric material layer, so as to form a gate and a gate dielectric layer. Thereafter, a deglazing process is performed and a hydrofluoric acid solution is used to remove impurities and a native oxide layer from the gate mask layer. Then, the gate mask layer is removed by a hot phosphoric acid solution to complete the fabrication of the gate structure.

However, the gate dielectric layer has low etching resistance to the hydrofluoric acid solution. As a consequence, the hydrofluoric acid solution may etch a portion of the gate dielectric layer during the deglazing process. In addition, the gate such as a doped polysilicon layer has low etching resistance to the hot phosphoric acid solution. Hence, the hot phosphoric acid solution may etch the gate and reduce the line width of the gate when the gate mask layer is removed. Consequently, the reliability and performance of the device are decreased.

SUMMARY OF THE INVENTION

In view of the above, the present invention provides a semiconductor fabricating process using two layers of spacers to protect a stacked structure, so as to greatly improve the reliability and performance of a device.

The present invention provides a semiconductor fabricating process. First, a substrate having thereon a stacked structure and a mask layer disposed on the stacked structure is provided. Next, an oxide layer is formed on a surface of the mask layer and a surface of at least a portion of the stacked structure. Then, a first spacer is formed on a sidewall of the stacked structure. Thereafter, a second spacer is formed on a sidewall of the first spacer. Following that, a first etching process is performed to remove the oxide layer on the surface of the mask layer. Then, a second etching process is performed to simultaneously remove the mask layer and the second spacer.

According to an embodiment of the present invention, in the aforesaid first etching process an etching rate of the oxide layer on the surface of the mask layer is larger than that of the second spacer.

According to an embodiment of the present invention, in the aforesaid second etching process an etching rate of the mask layer and the second spacer is larger than that of the first spacer.

In an embodiment of the present invention, a solution used in the aforesaid first etching process comprises a hydrofluoric acid solution, and a solution used in the second etching process comprises a phosphoric acid solution.

In an embodiment of the present invention, a material of the first spacer is, for example, silicon oxide.

In an embodiment of the present invention, a material of the second spacer is, for example, silicon nitride, silicon carbide, or silicon oxynitride.

In an embodiment of the present invention, the mask layer and the second spacer are formed by the same material.

In an embodiment of the present invention, a material of the mask layer is, for example, silicon nitride, silicon carbide, or silicon oxynitride.

In an embodiment of the present invention, the oxide layer is, for example, formed by performing a rapid thermal oxidation process.

In an embodiment of the present invention, the stacked structure is a gate structure.

In an embodiment of the present invention, the gate structure comprises a gate dielectric layer and a gate sequentially formed on the substrate.

In an embodiment of the present invention, the gate structure comprises a tunneling dielectric layer, a floating gate, an inter-gate dielectric layer, and a control gate sequentially formed on the substrate.

According to the semiconductor fabricating process of the present invention, the sidewalls of the stacked structures such as gate structures are protected by two layers of spacers, and thus the gate structure is not etched by the hydrofluoric acid or phosphoric acid solutions. Consequently, the reliability and performance of the device are greatly enhanced.

To make the above features and advantages of the present invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1E illustrate the cross-section views of a semiconductor fabricating process according to an embodiment of the present invention.

Figure 1A:
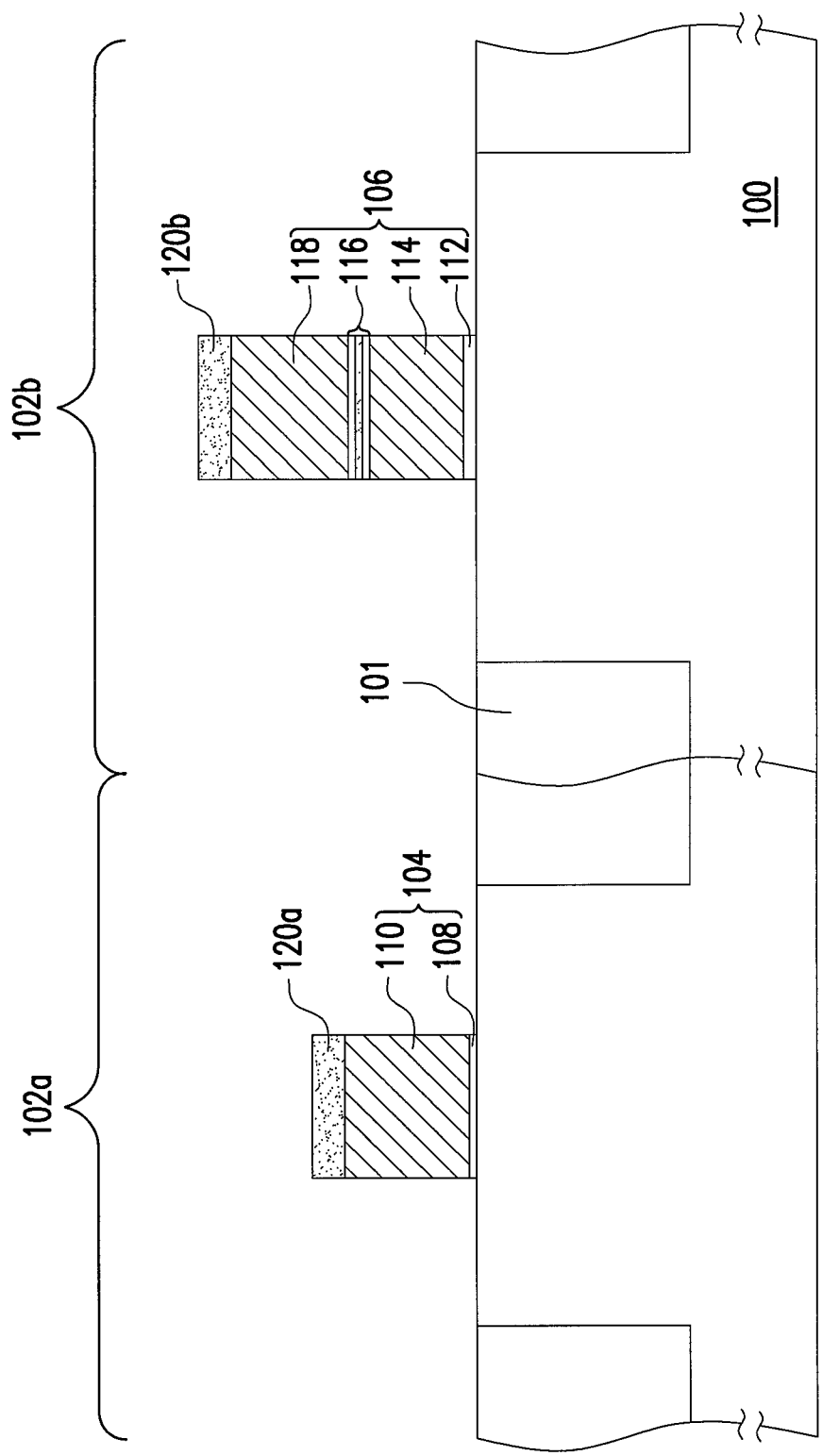
FIGS. 1A through 1E illustrate the cross-section views of a semiconductor fabricating process according to an embodiment of the present invention.

Referring to FIG. 1A, a substrate 100 is provided. On the substrate 100, stacked structures 104 and 106 and mask layers 120a and 120b respectively disposed on the stacked structures 104 and 106 are formed. The substrate 100 is, for example, a silicon substrate. The substrate 100 comprises areas 102a and 102b separated by an isolation structure 101. In this embodiment, an embedded flash (e-flash) process is performed, wherein the area 102a is to perform a logic device process in peripheral area and the area 102b is to perform a memory process in central area, for example. However, the present invention is not limited thereto.

The stacked structure 104 and the mask layer 120a disposed on the stacked structure 104 have been formed on the substrate 100 in the area 102a. A material of the mask layer 120a is, for example, silicon nitride, silicon carbide, or silicon oxynitride. The stacked structure 104 is, for example, a gate structure of a logic device, which comprises a gate dielectric layer 108 and a gate 110 sequentially formed on the substrate 100. The gate dielectric layer 108 is a silicon oxide layer, for instance. The gate 110 is, for example, a doped polysilicon layer. A method for forming the gate dielectric layer 108 and the gate 110 comprises a chemical vapor deposition process.

The stacked structure 106 and the mask layer 120b disposed on the stacked structure 106 have been formed on the substrate 100 in the area 102b. The mask layers 120b and 120a are formed by the same material, such as silicon nitride, silicon carbide, or silicon oxynitride. The stacked structure 106 is, for example, a gate structure of a memory. The gate structure comprises a tunneling dielectric layer 112, a floating gate 114, an inter-gate dielectric layer 116, and a control gate 118 sequentially formed on the substrate 100. The tunneling dielectric layer 112 is, for example, a silicon oxide layer. The inter-gate dielectric layer 116 is, for example, an oxide-nitride-oxide (ONO) composite layer. The floating gate 114 and the control gate 118 are, for example, doped polysilicon layers. A method for forming the tunneling dielectric layer 112, the floating gate 114, the inter-gate dielectric layer 116, and the control gate 118 comprises a chemical vapor deposition process.

Figure 1B:
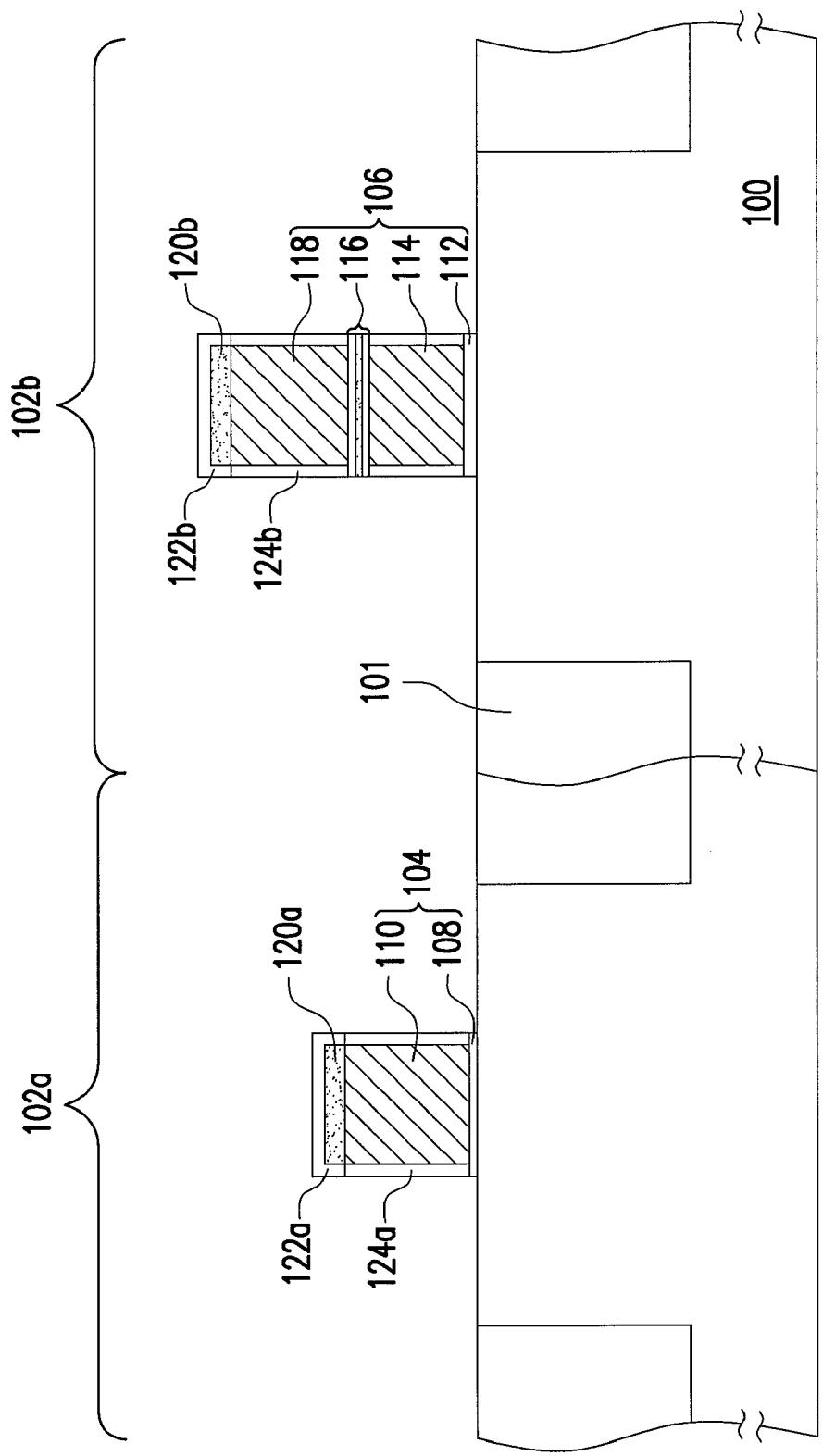

Then, referring to FIG. 1B, an oxide layer is formed on the surfaces of the mask layers 120a and 120b and at least a portion of the stacked structures 104 and 106. A method for forming the oxide layer comprises performing a rapid thermal oxidation (RTO) process. The rapid thermal oxidation process is to repair the damage to the lattice, which is caused when the stacked structures 104 and 106 are formed. The oxide layer may be divided into an oxide layer 122a, an oxide layer 122b, an oxide layer 124a, and an oxide layer 124b according to the positions thereof. The oxide layer 122a is formed on a sidewall and a top surface of the mask layer 120a. The oxide layer 122b is formed on a sidewall and a top surface of the mask layer 120b. The oxide layer 124a is formed on a sidewall of a portion of the stacked structure 104. Specifically, the oxide layer 124a is formed on a sidewall of the gate 110. The oxide layer 124b is formed on a sidewall of a portion of the stacked structure 106. Specifically, the oxide layer 124b is formed on the sidewalls of the floating gate 114 and the control gate 118.

Figure 1C:
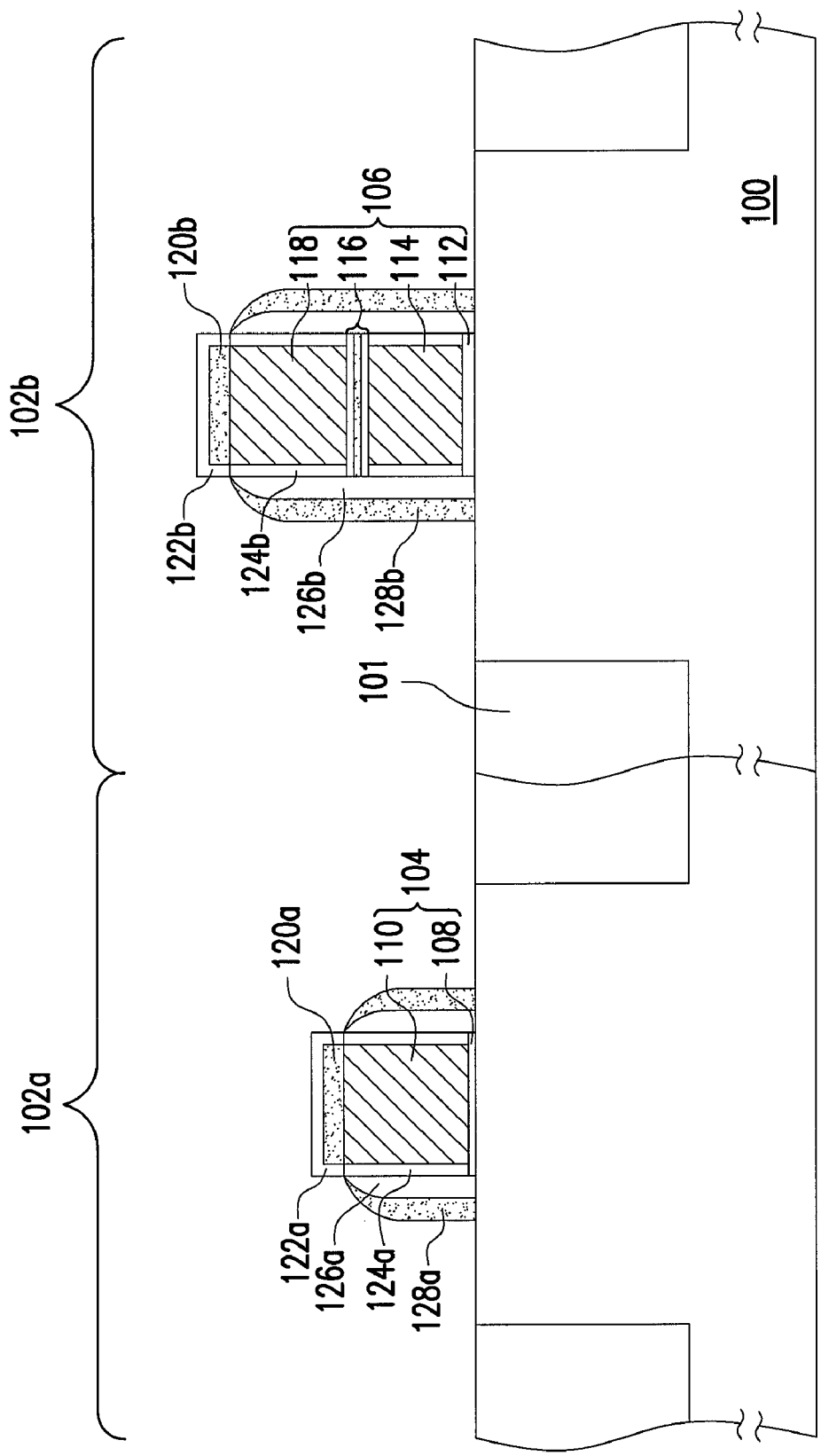

Next, referring to FIG. 1C, first spacers 126a and 126b are respectively formed on the sidewalls of the stacked structures 104 and 106. The first spacers 126a and 126b are, for example, formed by silicon oxide. A method for forming the first spacers 126a and 126b is, for example, to deposit a first spacer material layer (not shown) and then perform an anisotropic etching process to remove a portion of the first spacer material layer, so as to form the first spacers 126a and 126b. Additionally, the first spacer material layer and the oxide layers 122a and 122b are all formed by silicon oxide, for example. Hence, at least a portion of the oxide layers 122a and 122b is simultaneously removed (not shown) when the portion of the first spacer material layer is removed.

Thereafter, second spacers 128a and 128b are respectively formed on the sidewalls of the first spacers 126a and 126b. The second spacers 128a and 128b and the mask layers 120a and 120b are formed by the same material, such as silicon nitride, silicon carbide, or silicon oxynitride. A method for forming the second spacers 128a and 128b is, for example, to deposit a second spacer material layer (not shown) and then perform an anisotropic etching process to remove a portion of the second spacer material layer, so as to form the second spacers 128a and 128b.

Figure 1D:
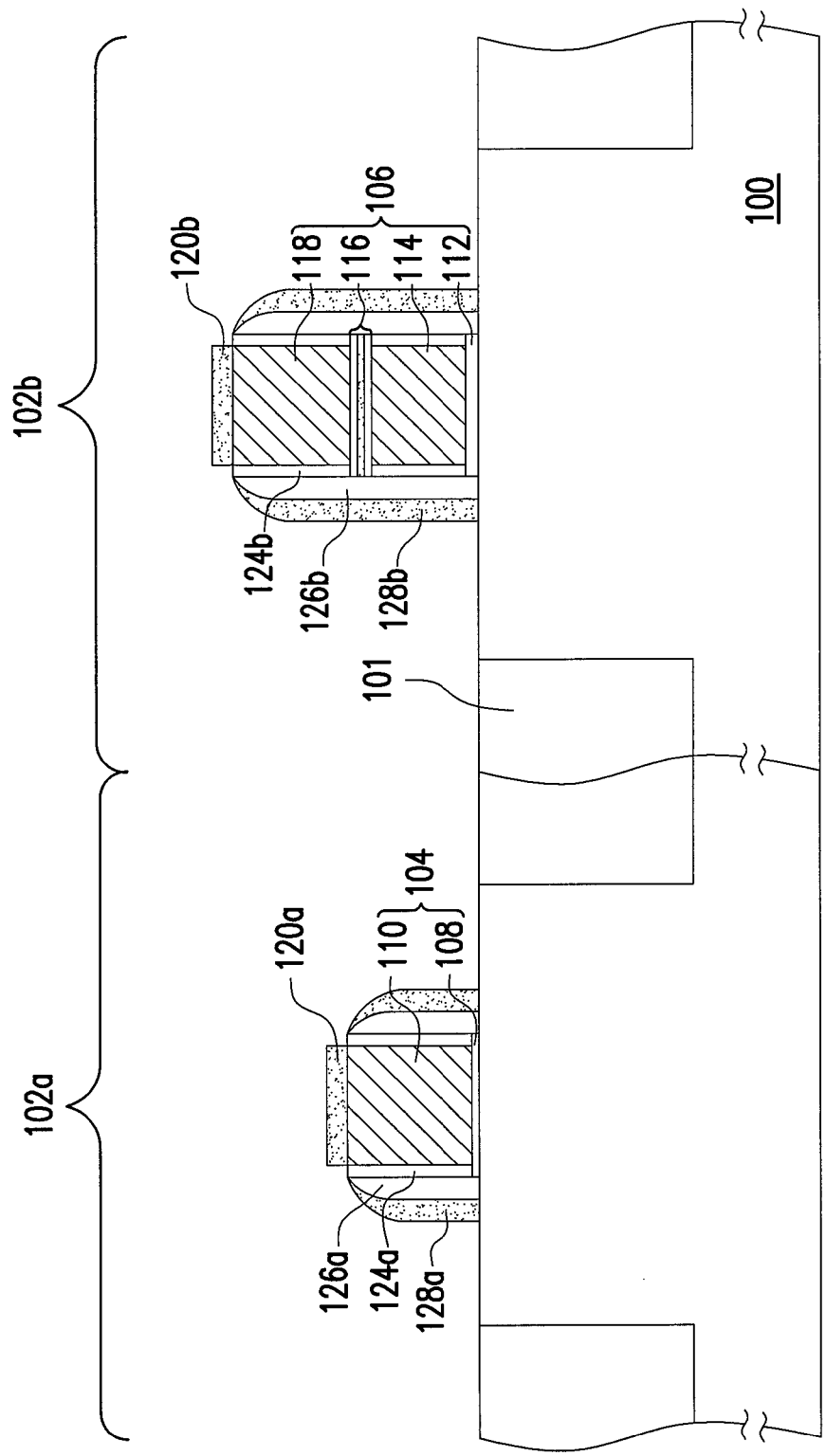

Thereafter, referring to FIG. 1D, a first etching process is performed to remove the oxide layers 122a and 122b on the surfaces of the mask layers 120a and 120b. The first etching process is, for example, a deglazing process. The deglazing process comprises a wet etching process, and a solution used therein comprises a hydrofluoric acid (HF) solution. In the hydrofluoric acid solution, a mixture ratio of water to hydrofluoric acid is between about 49:1 and 100:1, for instance.

Figure 1E:
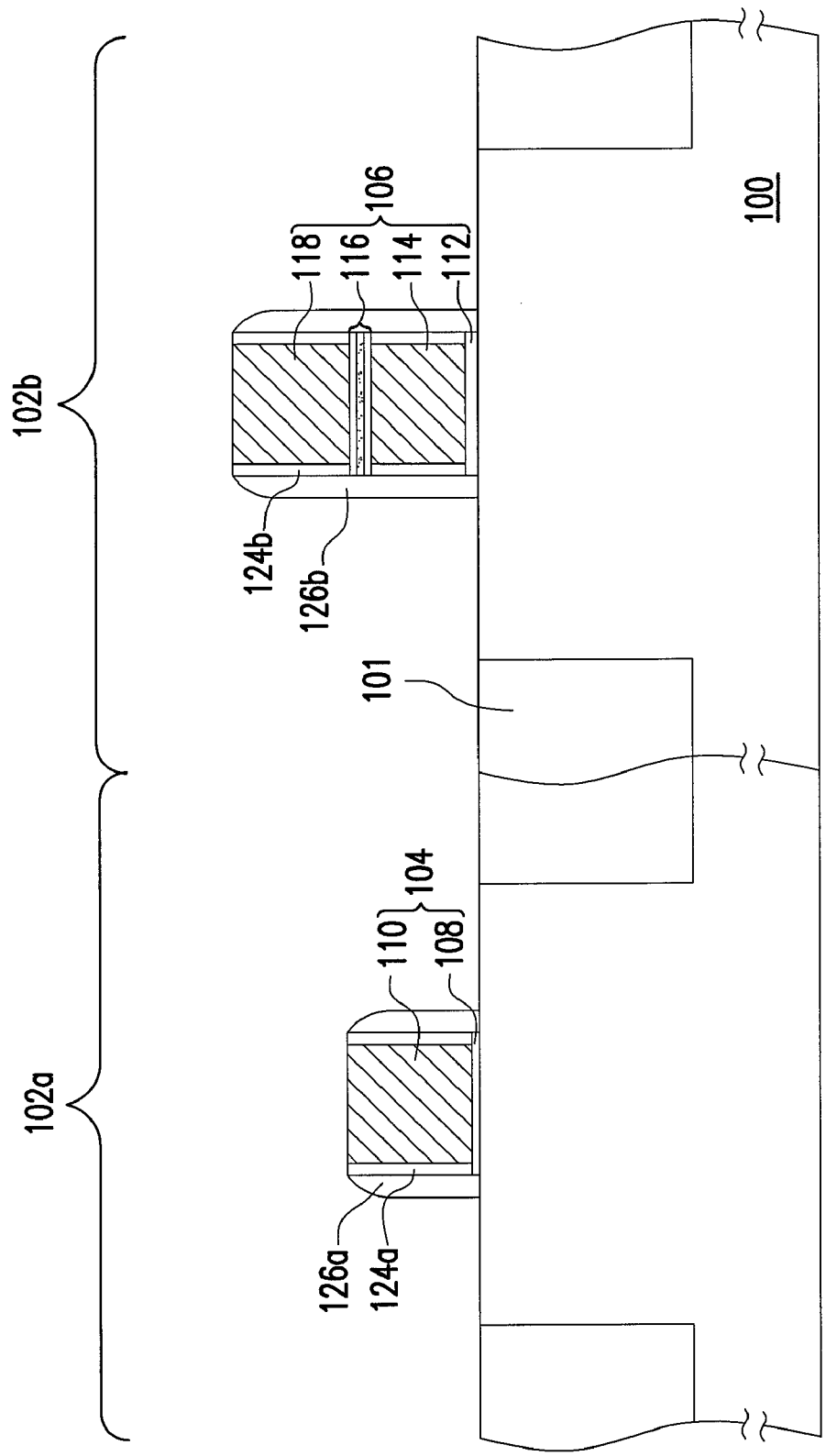

Then, referring to FIG. 1E, a second etching process is performed to simultaneously remove the mask layers 120a and 120b and the second spacers 128a and 128b. The second etching process comprises a wet etching process, and a solution used therein comprises a phosphoric acid ($H_3PO_4$) solution. In the phosphoric acid solution, a mixture ratio of water to phosphoric acid is between about 100:1 and 200:1, for instance. A temperature of the phosphoric acid solution is approximately larger than 150° C., e.g. between about 150° C. and 200° C.

It is noted that, in the first etching process (FIG. 1E), an etching rate of the oxide layers 122a and 122b on the surfaces of the mask layers 120a and 120b is larger than that of the second spacers 128a and 128b. Moreover, in the second etching process (FIG. 1F) an etching rate of the mask layers 120a and 120b and the second spacers 128a and 128b is larger than that of the first spacers 126a and 126b. In other words, the second spacers 128a and 128b and the first spacers 126a and 126b respectively serve as protection layers against the first and the second etching processes, so as to prevent the stacked structures 104 and 106 from being damaged by the first and the second etching processes.

In this embodiment, the second spacers 128a and 128b may be regarded as disposable spacers. Specifically, the second spacers 128a and 128b are formed on the sidewalls of the first spacers 126a and 126b first (FIG. 1C). When the hydrofluoric acid solution is used to perform the deglazing process in the first etching process (FIG. 1D), the second spacers 128a and 128b respectively protect the gate dielectric layer 108 and the tunneling dielectric layer 112 in the stacked structures 104 and 106 from being etched by the hydrofluoric acid solution. Then, when the phosphoric acid solution is used to remove the mask layers 120a and 120b in the second etching process, the second spacers 128a and 128b are simultaneously removed (FIG. 1E) because the mask layers 120a and 120b and the second spacers 128a and 128b are formed by the same material, such as silicon oxynitride. Furthermore, during the second etching process, the first spacers 126a and 126b protect the gate 110, the floating gate 114, the control gate 118, and even the inter-gate dielectric layer 116 in the stacked structures 104 and 106 from being etched by the phosphoric acid solution.

To conclude, in the semiconductor fabricating process of the present invention, the sidewalls of the stacked structures such as gate structures are protected by two layers of spacers, and thus the gate dielectric layer is not etched by the hydrofluoric acid solution and the gate is not etched by the phosphoric acid solution. Therefore, the reliability and performance of the device are greatly improved.

Although the present invention has been disclosed by the above embodiments, they are not intended to limit the present invention. Anybody with ordinary knowledge in the art may make some modifications and alterations without departing from the spirit and scope of the present invention. Therefore, the protection range of the present invention falls in the appended claims.

What is claimed is:

1. A semiconductor fabricating process, comprising:
providing a substrate having thereon a stacked structure and a mask layer disposed on the stacked structure;
forming an oxide layer on a surface of the mask layer and a surface of at least a portion of the stacked structure;

forming a first spacer on a sidewall of the stacked structure;
forming a second spacer on a sidewall of the first spacer;
performing a first etching process to remove the oxide layer on the surface of the mask layer; and
performing a second etching process to simultaneously remove the mask layer and the second spacer.

2. The semiconductor fabricating process as claimed in claim 1, wherein an etching rate of the oxide layer on the surface of the mask layer is larger than an etching rate of the second spacer in the first etching process.

3. The semiconductor fabricating process as claimed in claim 1, wherein an etching rate of the mask layer and the second spacer is larger than an etching rate of the first spacer in the second etching process.

4. The semiconductor fabricating process as claimed in claim 1, wherein a solution used in the first etching process comprises a hydrofluoric acid solution and a solution used in the second etching process comprises a phosphoric acid solution.

5. The semiconductor fabricating process as claimed in claim 1, wherein a material of the first spacer comprises silicon oxide.

6. The semiconductor fabricating process as claimed in claim 1, wherein a material of the second spacer comprises silicon nitride, silicon carbide, or silicon oxynitride.

7. The semiconductor fabricating process as claimed in claim 1, wherein the mask layer and the second spacer are formed by the same material.

8. The semiconductor fabricating process as claimed in claim 1, wherein a material of the mask layer comprises silicon nitride, silicon carbide, or silicon oxynitride.

9. The semiconductor fabricating process as claimed in claim 1, wherein the step of forming the oxide layer comprises performing a rapid thermal oxidation process.

10. The semiconductor fabricating process as claimed in claim 1, wherein the stacked structure is a gate structure.

11. The semiconductor fabricating process as claimed in claim 10, wherein the gate structure comprises a gate dielectric layer and a gate sequentially formed on the substrate.

12. The semiconductor fabricating process as claimed in claim 10, wherein the gate structure comprises a tunneling dielectric layer, a floating gate, an inter-gate dielectric layer, and a control gate sequentially formed on the substrate.

* * * * *